Figure 2:
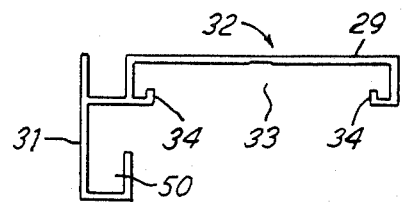

United States Patent [19]

Dobson

[11] Patent Number: 4,523,402
[45] Date of Patent: Jun. 18, 1985

[54] SIGN CONSTRUCTION

[76] Inventor: Charles E. Dobson, Rambles, Knole Park, Almondsbury, Bristol, England

[21] Appl. No.: 438,709

[22] Filed: Nov. 2, 1982

[30] Foreign Application Priority Data

Nov. 9, 1981 [GB] United Kingdom ................ 8133783
Dec. 4, 1981 [JP] Japan ................................ 56-181370

[51] Int. Cl.³ ............................................. G09F 15/00
[52] U.S. Cl. ....................................... 40/606; 40/618; 248/460; 211/186
[58] Field of Search ................. 40/606, 607, 618, 624; 248/460; 211/186

[56] References Cited

U.S. PATENT DOCUMENTS

| | | |
|---|---|---|
| 2,911,280 | 11/1959 | Cicogna . |
| 3,239,366 | 3/1966 | Miller et al. . |
| 3,363,557 | 1/1968 | Blake . |
| 3,441,425 | 4/1969 | Richlin . |
| 3,484,342 | 12/1969 | Blake et al. . |
| 3,508,492 | 4/1970 | Seibert et al. . |
| 3,574,964 | 4/1971 | Ownbey ............................ 40/606 |
| 3,666,397 | 5/1972 | Datye et al. . |
| 3,673,720 | 7/1972 | Thornton ........................... 40/607 |
| 3,707,346 | 12/1972 | Markert et al. . |
| 3,733,212 | 5/1973 | McCafferty . |
| 3,768,280 | 10/1973 | Kannegiesser et al. . |
| 3,813,218 | 5/1974 | de Plasse . |
| 3,880,579 | 4/1975 | Renaut . |
| 3,888,623 | 6/1975 | Clarke et al. . |
| 3,961,388 | 6/1976 | Jaffa . |
| 3,969,071 | 7/1976 | Hugelin . |
| 4,021,591 | 5/1977 | DeVries et al. . |
| 4,037,008 | 7/1977 | Tugwell . |
| 4,038,123 | 7/1977 | Sammis . |
| 4,058,644 | 11/1977 | DeVries et al. . |
| 4,059,471 | 11/1977 | Haigh . |
| 4,060,382 | 11/1977 | Vertegaal . |
| 4,068,398 | 1/1978 | Parisi ................................... 40/607 |
| 4,076,495 | 2/1978 | Decombe et al. . |
| 4,086,112 | 4/1978 | Porter . |
| 4,088,442 | 5/1978 | Hugelin et al. . |
| 4,096,310 | 6/1978 | Buckwalter et al. . |
| 4,116,022 | 9/1978 | Lopata et al. . |
| 4,138,945 | 2/1979 | Rejto . |
| 4,171,202 | 10/1979 | Sideman et al. . |
| 4,171,230 | 10/1979 | Bolliger et al. . |
| 4,178,782 | 12/1979 | Schiffer . |
| 4,205,991 | 6/1980 | Becker et al. . |
| 4,232,076 | 11/1980 | Stetson et al. . |
| 4,251,276 | 2/1981 | Ferree, Jr. et al. . |
| 4,253,838 | 3/1981 | Mizuno et al. . |
| 4,278,434 | 7/1981 | Krock et al. . |
| 4,315,643 | 2/1982 | Tokunaga et al. . |
| 4,357,773 | 11/1982 | Dennis .................................. 40/607 |

FOREIGN PATENT DOCUMENTS 2034391A 6/1980 United Kingdom .
2034504 7/1982 United Kingdom .

OTHER PUBLICATIONS

Textile Printing Symposium, pp. 22–24, 41–44, 7–25 (Appendix), (1971).
A Transfer Printing Guide, Sublistatic Corporation of America (circa 1976).
"Hostatherm Dyes for Transfer Printing", Technical Information–Pigments, Hoechst Aktiengesellschaft.
Burtonshaw, D., "Transfer Printing–Art or Science", Lecture Before Guild of Technical Dyers in Leicester.
Schmidt, H., "Thermo Transfer Printing with Dispersed Dyes", Farbwerke Hoechst AG.
Hofstetter, R., "Chemical and Technical Aspects of Transfer Printing".
Gorondy, E. J., "Analysis of What the Textile Printer Should Know About Heat Transfer Printing".
Moore, N. L., "Heat-Transfer Printing, A Review of the Literature", JSDC, pp. 318–325, Sep. 1974.
High Temperature Steam Fixation of Disperse Dyes on Polyester, Journal of American Association of Textile Chemists and Colorists, vol. 13, No. 4, Apr. 1981.
Velardi, N., So You Want to Get into Sublimation Dyes?, Screen Printing, Apr. 1976.
"Decorating" Encyclopedia of Polymer Science and Technology, vol. 4, pp. 612–616 (1966).
"Hot Stamping" Plastics Engineering Handbook, Van Nostrand & Reinhold, pp. 737–743 (1976).
"Hot Stamping" Modern Plastics Encyclopedia, pp. 440–441 (1977–1978).

*Primary Examiner*—Gene Mancene

*Assistant Examiner*—Wenceslao J. Contreras
*Attorney, Agent, or Firm*—Cushman, Darby & Cushman

[57] ABSTRACT

A sign comprises sign plates arranged edge-to-edge between a pair of mounting bars of L-shape, having a rear limb for mounting to a supporting surface and a side limb which conceals the ends of the plates. At least some of the plates have rearwardly directed limbs which are a push fit on forwardly projecting elements carried by base elements slidably engaged in restricted mouth channels formed on the rear limbs of the mounting bars. The top and bottom plates have extensions which conceal the mountings, and end caps plug into box sections on the side limbs of the mounting bars to conceal the ends of those limbs and the ends of the plate extensions.

5 Claims, 9 Drawing Figures

U.S. Patent Jun. 18, 1985 Sheet 1 of 3 4,523,402

SIGN CONSTRUCTION

This invention relates to sign constructions, and in a preferred embodiment it is a development of the type of sign disclosed in my Patent Specification GB No. 2034504. In that Specification, a number of parallel sign plates are a push fit onto clips which project from the mouths of channel shaped mounting members which are secured to a suitable support surface such as a wall. The present invention in a preferred embodiment provides an improvement on this which enhances the visual attractiveness of the sign and also renders it less liable to vandalism or otherwise unauthorised interference.

According to the present invention there is provided a sign construction comprising a plurality of plates arranged edge-to-edge and attached to a pair of mounting bars located at the ends of the plates and extending transversely to the length of the plates, each mounting bar comprising a generally L-shaped portion in cross-section formed from two limbs, of which a rear limb lies behind the plates and is adapted for securing to a support, and a side limb extends over and effectively conceals the ends of the plates, the plates at the ends of the mounting bars being provided with extensions which project rearwardly and at least largely conceal the rear limbs of the mounting bars and the attachment thereto of the plates.

Preferably forwardly projecting elements on the rear limbs of the mounting bars co-operate with rearwardly directed elements on at least some of the plates such that those plates are a push fit from the front of the sign onto said elements of the rear limbs of the mounting bars.

Figure 1:
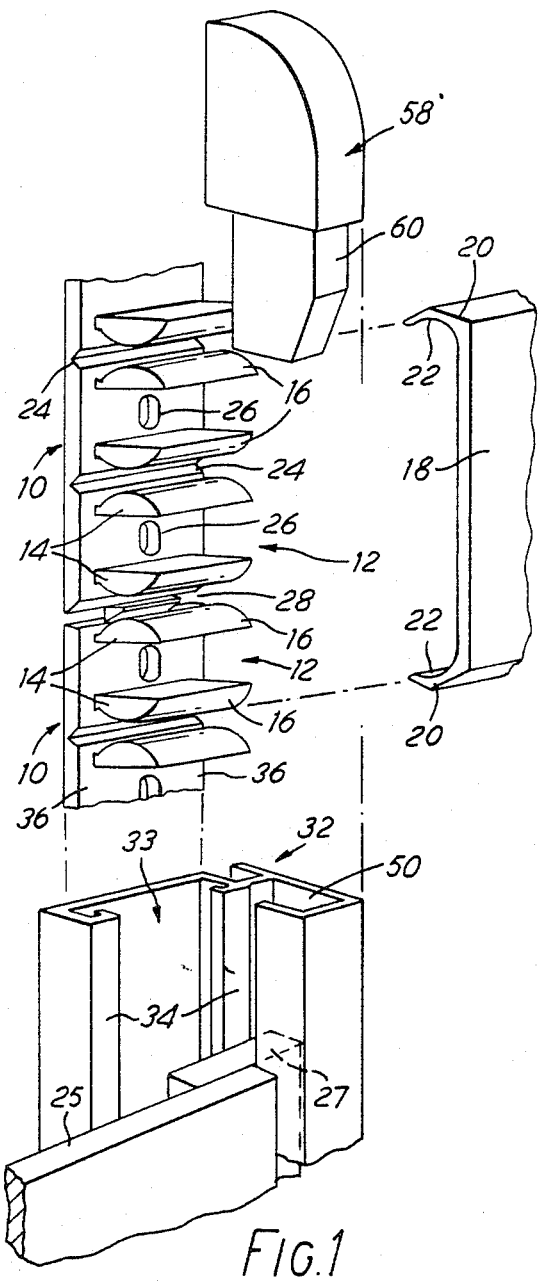
Figure 3:
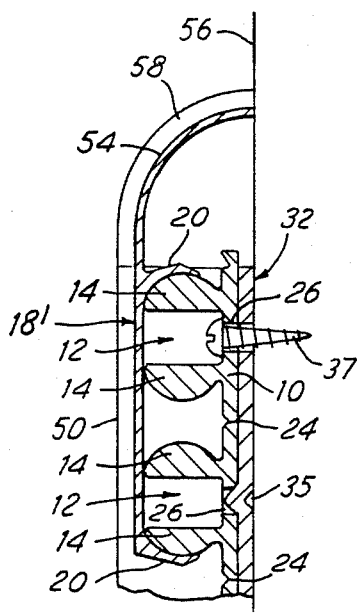
Figure 4:
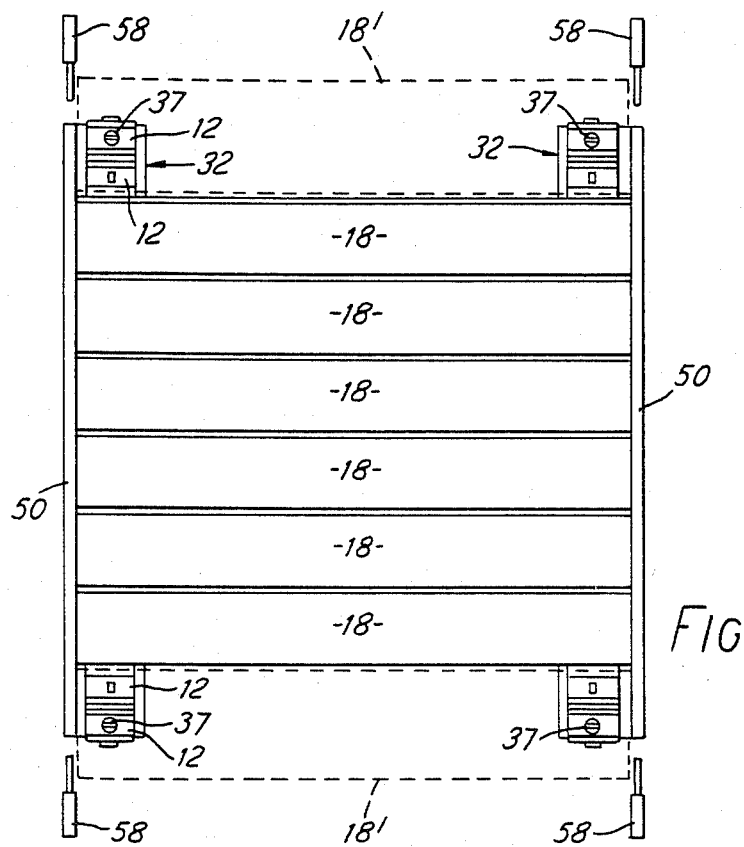
Figure 5:
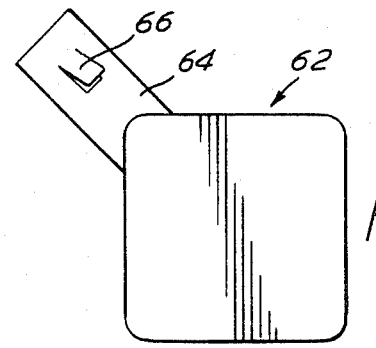
Figure 6:
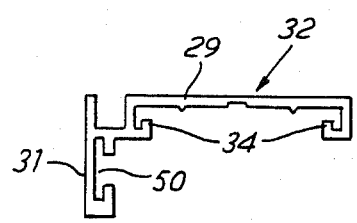
Figure 7:
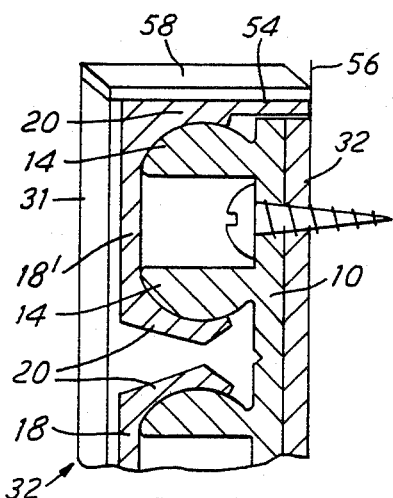
Figure 8:
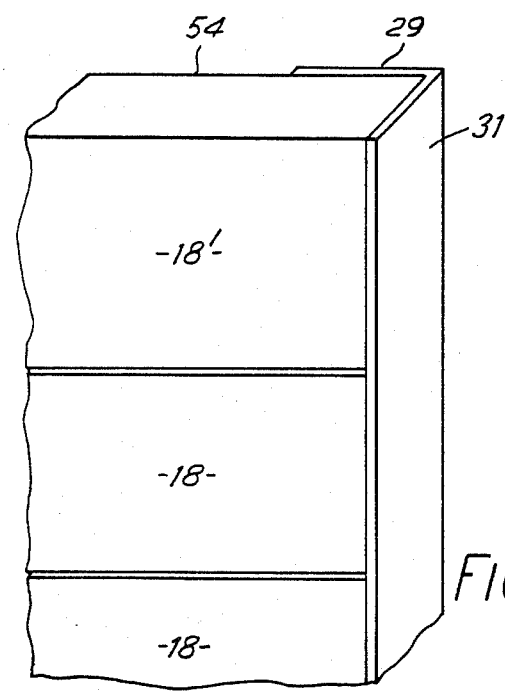
Figure 9:
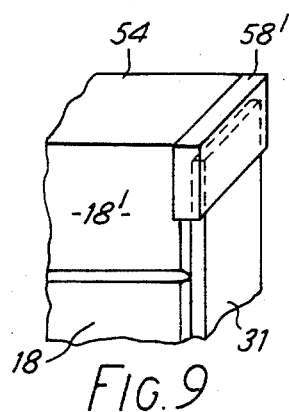

In order that the invention may be more clearly understood, various embodiments will now be described with reference to the accompanying drawings, wherein:

FIG. 1 shows a perspective fragmentary exploded view of part of a sign structure, FIG. 2 shows an end view of a mounting channel of FIG. 1, FIG. 3 shows a cross-sectional side view through part of a side mounting of the sign construction of FIG. 1, FIG. 4 shows a front view of the sign of FIG. 1 under construction, FIG. 5 shows a key for removing the sign plates, FIG. 6 shows an end view of a second embodiment of mounting channel, FIG. 7 shows a cross-sectional perspective view of part of a side mounting using the channel of FIG. 6, FIG. 8 shows a perspective view of part of a third embodiment of sign, and FIG. 9 shows a modification of the arrangement of FIG. 8.

Referring to FIGS. 1 to 5 of the drawings, a number of plate attachment members are injection moulded from plastics material, each comprising a generally flat base strip 10 from which project a number of heads 12 uniformly spaced apart along the strip. Each head comprises a pair of spaced elements 14, the mutually remote surfaces 16 of which are convex in cross-section. A sign plate 18, typically of extruded aluminium, is of shallow channel cross-section, having rearwardly directed flanges 20, the mutually facing surfaces 22 of which are concave. The flanges 20 are spaced apart by an amount corresponding to the unit centre-to-centre spacing of the heads 12 or a multiple thereof. In the plate shown in FIG. 1 the spacing of the flanges corresponds to three times this unit spacing, so that the plate embraces three heads on the strip. The plate is mounted to the strip by resiliently pushing the flanges 20 over the two outermost elements 14 of the set of three heads thus embraced, the concave surfaces of the flanges being retained by the convex surfaces of said elements.

The strip 10 is formed with grooves 24 between adjacent heads, which provide lines of weakening, whereby portions of the strip having one or more complete heads can be broken therefrom. In this way, suitable lengths of strip can be selected. The strip has an aperture 26 between each pair of head forming elements.

A mounting bar 32, for example of extruded aluminium, is of generally L-shape with two limbs 29,31 at right-angles to each other. One limb 29 is formed with a channel 33 provided with inturned lips 34 at the mouth. The strips 10 of the attachment members project laterally a short distance beyond the heads 12, providing lateral flanges 36, so that the strips can be slid lengthwise into the channel 33, the flanges 36 being retained behind the lips 34. The strips can be retained lengthwise by punching indentations 35 in the base of the channel 33 in register with apertures 26, as shown in FIG. 3. The mounting bar 32 thus forms a carrier for an appropriate number of attachment members, and the length of the mounting bar is cut to match the combined length of the attachment members required to mount the various sign plates which are to form the sign.

A pair of mounting bars 32, carrying plate attachment members, are thus arranged parallel to each other, as shown in FIG. 4, and sign plates 18 are pressed onto the heads. The mounting bars project somewhat beyond the sign plates, as can be seen in FIG. 4, so that each provides two heads 12 respectively above and below the sign plates. The mounting bars are secured to a supporting surface, such as a wall 56 (see FIG. 3), by drilling through some of the still exposed apertures 26 and base of the channel in register with the apertures, and passing fixing screws 37 through them.

The other limb 31 of each of the mounting bars 32 has the form of a box section 50. These limbs 31 provide side walls which close and conceal the ends of the plates 18, as can be seen in FIGS. 3 and 4. Also, as can be seen in FIGS. 3 and 4, on the projecting pairs of heads 12 at the ends of the mounting bars are engaged special plate members 18' which resemble the plates 18, but have curved extensions 54 which enclose the ends of the channels, and meet the supporting surface 56 to which the channels are mounted, thereby effectively concealing the rear limbs 29 and the attachment members. The construction is completed by fitting end cap members 58, suitably made of injection moulded plastics material. These end caps have plug portions 60 which fit tightly into the open ends of the box-section wall portions 50 of the limbs 31, and can be secured in place by adhesive if desired. As can be seen from FIG. 3, the profile of the end cap matches that of the extension portion 54 of the plate 18', thus providing a matching extension of the wall 50.

By making the limb 31 of open, i.e. channel, box section 50, a flat panel 25 could be incorporated in the sign, with its edges 27, e.g. offset, engaged in the channel 50, provided the plate attachment members 10 were omitted in that region. Thus the sign could include both elongate plates 18,18' and much deeper flat panels 25 of a size impracticable for extrusion. This could be useful, for example, for showing a floor plan of a building.

The completed sign thus presents a neat appearance with no visible fixing screws. Moreover, the close spacing of the plates 18 and 18', and the extension of the portions 54 of the upper and lower plates 18' to meet the supporting surface 56, does not provide any obvious means by which the sign can be removed from the wall. However, a special key device 62, comprising a prong 64 having a tang 66, as shown in FIG. 5, can be inserted between a pair of plates and then withdrawn, so that the tang engages behind a flange 20 of a plate and pulls the plate from its mounting.

Referring to FIGS. 6 and 7, the construction resembles that of FIGS. 1 to 4, except that the extensions 54 of the plates 18' are straight extensions of one of the flanges 20, so that externally a squared-off rather than a rounded appearance is presented. The end cap member 58 is correspondingly flat to match, and the limb 31 of the mounting bar 32 is somewhat narrower to be in proportion aesthetically.

In FIG. 7 the mounting bar 32 is still further abbreviated, so that the limb 31 is a simple flange without a box section. As a result no plug-in end cap is fitted, and the edge of the rear limb 29 will be exposed. However, as shown in FIG. 8, the mounting bars could terminate just short of the plate extensions 54, so that the edge of the rear limb 29 is hidden, and a slim end cap 58' is push fitted over the limb 31. This would result in the ends of the plates 18,18' being slightly spaced from the limb 31, but this need not be a disadvantage as the prong 64 of the key 62 can be inserted in the gap to detach a plate rather than inserting it between adjacent plates which could damage their surface appearance.

In the foregoing embodiments a particular preferred method of attaching the plates to the mounting bars has been described, using the system disclosed in GB No. 2034504, but other means of attachment, preferably a push-on clip or friction fit, could be employed.

I claim:

1. A sign construction comprising:

a plurality of elongated indicia-bearing generally rectangular plates arranged edge-to-edge;

a pair of mounting bars located at the ends of said plates and extending transversely to the length thereof;

means attaching said plate ends to said bars;

each mounting bar comprising a generally L-shaped portion in cross-section formed with a rear limb lying behind said plates and adapted to be secured to a support, and a side limb extending over and effectively concealing said plate ends;

the plates at the ends of said bars being provided with extensions which project rearwardly and at least largely conceal said rear limbs and said attaching means.

2. A sign construction according to claim 5 wherein the box section is of inwardly opening channel form, and at least one of said plates is a flat panel having end edges engaging in and retained by the channel box sections.

3. A sign construction in accordance with claim 1 wherein the attaching means comprises forwardly projecting elements on the rear limbs and rearwardly directed elements on at least some of the plates push fitted from the front of the sign onto said forwardly projecting elements.

4. A sign construction according to claim 3 wherein the rear limbs have longitudinal restricted mouth channels and the attaching means includes base elements carrying the forwardly projecting elements and slidably engaged in said channels.

5. A sign construction according to claim 1 wherein the side limbs are of box section and including end cap plugs push fitted into the ends of said side limbs to conceal such ends and also the ends of the plate extensions.

* * * * *